(12) United States Patent
Howald et al.

(10) Patent No.: US 9,927,481 B2
(45) Date of Patent: Mar. 27, 2018

(54) CABLE POWER LOSS DETERMINATION FOR VIRTUAL METROLOGY

(71) Applicant: Lam Research Corporation, Fremont, CA (US)

(72) Inventors: Arthur M. Howald, Pleasanton, CA (US); John C. Valcore, Jr., Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/427,978

(22) Filed: Feb. 8, 2017

(65) Prior Publication Data

US 2017/0146581 A1     May 25, 2017

Related U.S. Application Data

(63) Continuation of application No. 14/152,791, filed on Jan. 10, 2014, now Pat. No. 9,594,105.

(51) Int. Cl.
| | | |
|---|---|---|
| *G01R 27/16* | (2006.01) | |
| *G01R 31/02* | (2006.01) | |
| *G01R 27/06* | (2006.01) | |
| *G01R 21/133* | (2006.01) | |

(52) U.S. Cl.
CPC ......... *G01R 31/021* (2013.01); *G01R 21/133* (2013.01); *G01R 27/06* (2013.01)

(58) Field of Classification Search
CPC ...... G01R 31/021; G01R 31/02; G01R 27/06; G01R 27/16
See application file for complete search history.

(56) References Cited

U.S. PATENT DOCUMENTS

2002/0185227 A1* 12/2002 MacGearailt ....... H01J 37/3299
156/345.43

* cited by examiner

*Primary Examiner* — Toan Le
(74) *Attorney, Agent, or Firm* — Martine Penilla Group, LLP

(57) ABSTRACT

A method for modeling cable loss is described. The method includes receiving a measurement of reverse power and forward power at a radio frequency (RF) generator. The method further includes computing theoretical power delivered to a matching network as a difference between the forward power and the reverse power and calculating a ratio of the reverse power to the forward power to generate an RF power reflection ratio. The method further includes identifying a cable power attenuation fraction based on a frequency of the RF generator and calculating a cable power loss as a function of the RF power reflection ratio, the cable power attenuation fraction, and the theoretical power. The method includes calculating actual power to be delivered to the impedance matching network based on the theoretical power and the cable power loss and sending the calculated actual power to the RF generator to generate an RF signal.

15 Claims, 7 Drawing Sheets

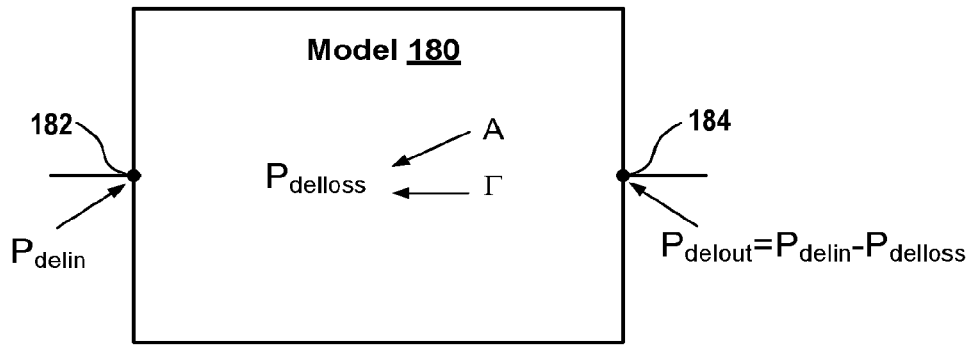
Fig. 2A
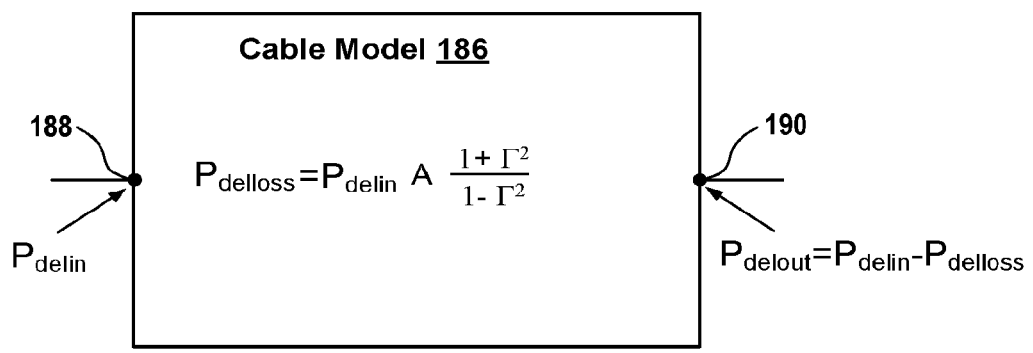
Fig. 2B
L of the RF Cable
A
of an
RF Cable
Freq. of operation of RF gen
Fig. 3

CABLE POWER LOSS DETERMINATION FOR VIRTUAL METROLOGY

CLAIM OF PRIORITY

The present patent application is a continuation of and claims priority, under 35 U.S.C. § 120, to U.S. patent application Ser. No. 14/152,791, filed on Jan. 10, 2014, and titled "Cable Power Loss Determination for Virtual Metrology", now U.S. Pat. No. 9,594,105, which is incorporated by reference herein in its entirety.

FIELD

The present embodiments relate to determination of cable power loss for virtual metrology.

BACKGROUND

Plasma systems are used to supply power to a plasma chamber. The power is generated by an RF generator and is supplied by the RF generator via a matchbox to generate plasma within the plasma chamber.

Within the plasma chamber is a wafer, which is processed by the plasma. The wafer is etched, or deposited on, or cleaned with the plasma. During processing of the wafer, it is important to control the plasma to achieve accuracy in the processing and to increase wafer yield.

To measure properties of the power that is supplied and to measure properties of the plasma, a sensor is connected to an input of the matchbox. However, use of the sensor is costly, time consuming, and prone to errors.

It is in this context that embodiments described in the present disclosure arise.

SUMMARY

Embodiments of the disclosure provide apparatus, methods and computer programs for determining cable power loss using virtual metrology. It should be appreciated that the present embodiments can be implemented in numerous ways, e.g., a process, an apparatus, a system, a device, or a method on a computer-readable medium. Several embodiments are described below.

In some embodiments, instead of a sensor that is coupled to an input of an impedance matching network, a processor is used to determine actual delivered power at the input. A voltage and current probe measures a complex voltage and current at an output of a radio frequency (RF) generator. The complex voltage and current is used to calculate theoretical delivered power at the output of the RF generator. The actual delivered power at the input of the impedance matching network is determined as a function of the theoretical delivered power, a cable power attenuation fraction of an RF cable that connects the impedance matching network to the RF generator, and an RF power reflection ratio. The RF power reflection ratio is determined by the processor based on forward power that is measured at the output of the RF generator and reverse power that is measured at the output of the RF generator.

In various embodiments, a method for modeling cable loss is described. The method includes receiving a measurement of reverse power at a radio frequency (RF) generator, which is coupled via an RF cable to an impedance matching network. The impedance matching network is coupled via an RF transmission line to a plasma chamber. The RF generator has a frequency of operation. The method further includes receiving a measurement of forward power at the RF generator, computing theoretical power delivered to the impedance matching network as a difference between the forward power and the reverse power, and calculating a ratio of the reverse power to the forward power to generate an RF power reflection ratio. The method further includes identifying a cable power attenuation fraction of the RF cable based on the frequency of operation of the RF generator, and calculating a cable power loss as a function of the RF power reflection ratio, the cable power attenuation fraction, and the theoretical power. The method includes calculating actual power to be delivered to the impedance matching network based on the theoretical power and the cable power loss and sending the calculated actual power to the RF generator to generate an RF signal. The method is executed by a processor.

In several embodiments, a method includes receiving a measurement of reverse power at an RF generator, which is coupled via an RF cable to an impedance matching network. The impedance matching network coupled via an RF transmission line to a plasma chamber. The RF generator has a frequency of operation. The method further includes receiving a measurement of forward power at the RF generator, computing theoretical power delivered to the impedance matching network as a difference between the forward power and the reverse power, and calculating a ratio of the of the reverse power to the forward power to generate an RF power reflection ratio. The method includes identifying a cable power attenuation fraction of the RF cable based on the frequency of operation of the RF generator and calculating a cable power loss as a function of the RF power reflection ratio, the cable power attenuation fraction, and the theoretical delivered power. The method includes calculating actual power to be delivered to the impedance matching network based on the theoretical delivered power and the cable power loss, and determining an actual power at a node associated with a computer-generated model based on the actual power delivered to the impedance matching network. The method is executed by a processor.

In some embodiments, a plasma system includes a radio frequency (RF) generator for supplying forward power. The RF generator has a frequency of operation. The plasma system further includes an impedance matching circuit coupled to the RF generator for receiving the forward power and to generate a modified RF signal based on the forward power. The plasma system includes an RF cable coupling the RF generator to the impedance matching circuit to facilitate a transfer of the forward power to the impedance matching circuit, and a plasma chamber coupled to the impedance matching circuit via an RF transmission line. The plasma chamber is used for generating plasma based on the modified RF signal. The plasma system includes a sensor coupled to the RF generator to measure the forward power and to measure reverse power. The reverse power is reflected from the plasma towards the RF generator via the RF cable. The plasma system further includes a host system coupled to the sensor for receiving the measurement of the forward power and the reverse power. The host system is configured to compute theoretical power delivered to the impedance matching circuit as a difference between the forward power and the reverse power, calculate a ratio of the of the reverse power to the forward power to generate an RF power reflection ratio, and identify a cable power attenuation fraction of the RF cable based on the frequency of operation of the RF generator. The host system is further configured to calculate a cable power loss as a function of the RF power reflection ratio, the cable power attenuation fraction, and the theoretical delivered power. The host system is configured to calculate actual power to be delivered to the impedance matching circuit based on the theoretical delivered power and the cable power loss and send the calculated actual power to the RF generator to control the RF generator.

Some advantages of the above-described embodiments include using a cable power attenuation fraction of an RF cable, an RF power reflection ratio of an output of an RF generator, and theoretical delivered power at the output of the RF generator to determine actual delivered power at an input of an impedance matching network. There is no need to use a sensor at the input of the impedance matching network to measure actual delivered power at the input. Use of the sensor takes time to connect the sensor and to measure the actual delivered power at the input. Moreover, the sensor is costly and any measurements generated by the sensor are prone to errors.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A is a diagram of a cable model, which is a computer-generated model of a radio frequency (RF) cable of the plasma system of FIG. 1, in accordance with various embodiments described in the present disclosure.

FIG. 2B is a diagram of another cable model, in accordance with several embodiments described in the present disclosure.

FIG. 3 is a diagram used to illustrate that a cable power attenuation fraction associated with an attenuation of power by an RF cable is dependent upon a length of the RF cable and a frequency of operation of an RF generator that is connected to the RF cable, in accordance with some embodiments described in the present disclosure.

DETAILED DESCRIPTION

The following embodiments describe systems and methods for cable power loss determination using virtual metrology. It will be apparent that the present embodiments may be practiced without some or all of these specific details. In other instances, well known process operations have not been described in detail in order not to unnecessarily obscure the present embodiments.

Figure 1:
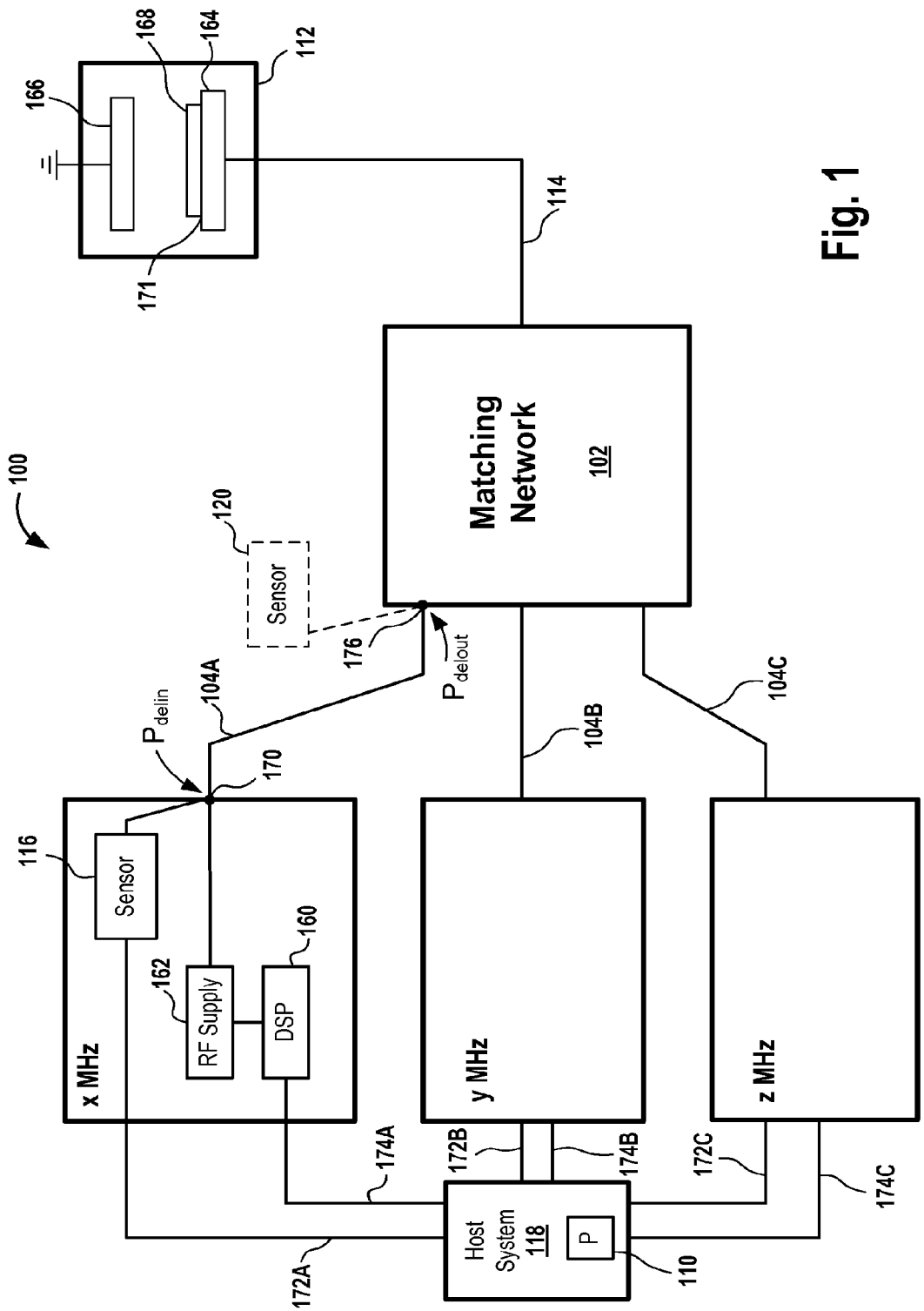
FIG. 1 is a diagram of a plasma system for cable power loss determination, in accordance with some embodiments described in the present disclosure.

FIG. 1 is a diagram of an embodiment of a plasma system 100 for cable power loss determination. The plasma system 100 includes an x megahertz (MHz) radio frequency (RF) generator, a y MHz RF generator, and a z MHz RF generator. Examples of x MHz include 2 MHz, 27 MHz, and 60 MHz. Examples of y MHz include 2 MHz, 27 MHz, and 60 MHz. Examples of z MHz include 2 MHz, 27 MHz, and 60 MHz.

In some embodiments, the x MHz is different than y MHz and z MHz, and y MHz is different than z MHz. For example, when x MHz is 2 MHz, y MHz is 27 MHz and z MHz is 60 MHz.

In some embodiments, each RF generators includes a digital signal processor (DSP) and an RF supply. For example, the x MHz RF generator includes a DSP 160 and an RF supply 162. The DSP 160 is coupled to the RF supply 162 and to a host system 118. Similarly, the host system 118 is coupled to a DSP (not shown) of the y MHz RF generator and to a DSP (not shown) of the z MHz RF generator. A DSP of an RF generator is coupled to an RF supply of the RF generator.

Each RF generator includes a complex voltage and current sensor. For example, the x MHz RF generator includes a sensor 116 that is coupled to an RF cable 104A at an output 170 of the x MHz RF generator to measure a complex voltage and current at the output. In various embodiments, a complex voltage and current sensor that is used to calibrate the x, y, or z MHz RF generator at an output of the RF generator follows a National Institute of Standards and Technology (NIST) standard. For example, the sensor 116 used to calibrate the x MHz RF generator is NIST traceable. The NIST standard provides a degree of accuracy specified by the NIST standard to a complex voltage and current sensor.

In some embodiments, a complex voltage and current includes a magnitude of the current, a magnitude of the voltage, and a phase between the current and the voltage. In some embodiments, a complex variable, e.g., a complex impedance, complex power, etc., includes a magnitude of the variable and a phase of the variable.

In some embodiments, the sensor 116 measures reverse power $P_{rev}$ of the x MHz RF generator and forward power $P_{fwd}$ of the x MHz RF generator. For example, the sensor 116 measures the reverse power $P_{rev}$ of the x MHz RF generator at the output 170 of the x MHz RF generator and measures the forward power $P_{fwd}$ of the x MHz RF generator at the output 170. The forward power of an RF generator is power of an RF signal supplied by the RF generator to an impedance matching network 102. The reverse power of an RF generator is power reflected from the plasma chamber 166 via an RF transmission line 114, the impedance matching network 102, and a corresponding RF cable to the RF generator. For example, the reverse power of the x MHz RF generator is power reflected by plasma formed within the plasma chamber 166 via the RF transmission line 114, the impedance matching network 114, and the RF cable 104A to the x MHz RF generator.

In some embodiments, reverse power is complex power and forward power is complex power.

In several embodiments, the impedance matching network 102 is a circuit of one or more inductors and/or one or more capacitors. Each component, e.g., inductor, capacitor, etc., of the impedance matching network 102 is connected in series, or in parallel, or acts as a shunt, to another component of the impedance matching network 102.

In various embodiments, an RF cable includes an inner conductor that is surrounded by an insulation material, which is surrounded by an outer conductor, which is further surrounded by a jacket. In several embodiments, the outer conductor is made of braided wire and the jacket is made of an insulator material. In some embodiments, an RF cable has an internal impedance. In various embodiments, an RF cable has a characteristic impedance, which is a function of an inductance and/or a capacitance of the RF cable.

The host system 118 includes one or more processors, e.g., a processor 110, etc., and one or more memory devices. Examples of a processor include a central processing unit (CPU), a microprocessor, an application specific integrated circuit (ASIC), and a programmable logic device (PLD), etc. Examples of a memory device include a read-only memory (ROM), a random access memory (RAM), or a combination thereof. Other examples of a memory device include a flash memory, a non-transitory computer-readable storage medium, a redundant array of storage disks (RAID), a hard disk, etc.

The plasma system 100 further includes the impedance matching network 102 that is coupled to the x, y, and z MHz RF generators. The impedance matching network 102 is coupled to the x MHz RF generator via the RF cable 104A, to the y MHz RF generator via another RF cable 104B, and to the z MHz RF generator via an RF cable 104C.

In some embodiments, the impedance matching network 102 includes a network of RF electrical circuit elements, e.g., capacitors, inductors, etc., coupled with each other.

The impedance matching network 102 is coupled to the plasma chamber 112 via the RF transmission line 114. In various embodiments, the RF transmission line 114 includes a cylinder, e.g., a tunnel, etc., that is connected to the impedance matching network 102. Within a hollow of the cylinder lies an insulator and an RF rod. The RF transmission line 114 further includes an RF spoon, e.g., an RF strap, etc., that is coupled at one end to the RF rod of the cylinder. The RF spoon is coupled at another end to an RF rod of a vertically placed cylinder and the RF rod is coupled to a chuck 164 of the plasma chamber 112.

The plasma chamber 112 includes the chuck 164, an upper electrode 166, and other parts (not shown), e.g., an upper dielectric ring surrounding the upper electrode 166, an upper electrode extension surrounding the upper dielectric ring, a lower dielectric ring surrounding a lower electrode of the chuck 164, a lower electrode extension surrounding the lower dielectric ring, an upper plasma exclusion zone (PEZ) ring, a lower PEZ ring, etc. The upper electrode 166 is located opposite to and facing the chuck 164. A work piece 168 is supported on an upper surface 171 of the chuck 164. Each of the lower electrode and the upper electrode 166 is made of a metal, e.g., aluminum, alloy of aluminum, copper, etc. The chuck 164 may be an electrostatic chuck (ESC) or a magnetic chuck. The upper electrode 166 is coupled to a reference voltage, e.g., a ground voltage, a zero voltage, a negative voltage, etc.

In some embodiments, the work piece 168 includes a semiconductor wafer. Various processes, e.g., chemical vapor deposition, cleaning, deposition, physical vapor deposition (PVD), chemical vapor deposition (CVD), plasma-enhanced CVD (PECVD), metal CVD, a high-density plasma CVD (HDP-CVD) function, a photoresist strip function, a photoresist surface preparation, ultraviolet thermal processing (UVTP), sputtering, etching, ion implantation, resist stripping, etc., are performed on the work piece 168 during production. Integrated circuits, e.g., application specific integrated circuit (ASIC), programmable logic device (PLD), etc. are developed on the semiconductor wafer and the integrated circuits are used in a variety of electronic items, e.g., cell phones, tablets, smart phones, computers, laptops, networking equipment, etc. In various embodiments, the work piece 168 includes a substrate, one or more layers, e.g., oxide layers, etc., on top of the substrate, and integrated circuits on top of the substrate. In several embodiments, the work piece 168 includes a substrate, one or more layers, e.g., oxide layers, etc., on top of the substrate, and integrated circuits on top of the layers. In various embodiments, the work piece 168 includes a substrate and integrated circuits formed on top of the substrate.

In various embodiments, the upper electrode 166 includes one or more gas inlets, e.g., holes, etc., that are coupled to a central gas feed (not shown). The central gas feed receives one or more process gases from a gas reservoir (not shown). An example of a process gas includes an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc.

The host system 118 sends control values, e.g., values of complex power, values of frequencies of operation, etc., to the x, y, and z MHz RF generators. For example, the processor 110 provides a value of complex power and a value of a frequency of operation to the DSP 160 of the x MHz RF generator.

The DSPs of the x, y, and z MHz RF generators receive the control values and generate supply values, e.g., values of complex power, values of frequencies of operation, etc., based on the control values to provide to the RF supplies of the RF generators. For example, the DSP 160 of the x MHz RF generator generates a supply value of complex power and supply value of a frequency of operation to provide to the RF supply 162 of the x MHz RF generator. In some embodiments, a supply value is the same as a control value. In various embodiments, a supply value is a drive value that is looked-up from a memory device of an RF generator by a DSP of the RF generator based on a control value.

The RF supplies of the x, y, and z RF generators generate an RF signal in response to receiving a supply value. For example, the RF supply 162 generates an RF supply signal upon receiving a drive complex power value and a drive operation frequency value from the DSP 160. Similarly, the y and z MHz RF generators generate RF signals.

The RF signals that are generated by the x, y, and z MHz RF generators are supplied via the RF cables that couple the generators to the impedance matching network 102. For example, an RF signal that is generated by the x MHz RF generator is supplied via the RF cable 104A to the impedance matching network 102.

Upon receiving the RF signals from the x, y, and z MHz RF generators, the impedance matching network 102 matches an impedance of a load coupled to the impedance matching network 102 with an impedance of a source coupled to the impedance matching network 102 to generate a modified RF signal. For example, the impedance matching network 102 matches an impedance of an RF transmission line 114 and a plasma chamber 112 with an impedance of the x MHz RF generator, the y MHz RF generator, the z MHz RF generator, the RF cable 104A, the RF cable 104B, and the RF cable 104C to generate the modified RF signal. As another example, the impedance matching network 102 matches an impedance of any components of the plasma system 100 coupled to the impedance matching network 102 as a load with an impedance of any components of the plasma system 100 coupled to the impedance matching network 102 as a source to generate the modified RF signal. Examples of components coupled to the impedance matching network 102 as a load include the RF transmission line 114, the plasma chamber 112, and any other components, such as, for example, a filter, etc., coupled to the impedance matching network 102 on a side of the impedance matching network 102 on which the plasma chamber 112 is located. Example of components coupled to the impedance matching network 102 as a source include the x, y, and z RF generators, the RF cables 104A, 104B, and 104C, and other components, e.g., a filter, etc., coupled to a side of the impedance matching network 102 on which the RF generators are located.

The modified signal is sent by the impedance matching network 102 via the RF transmission line 114 to the chuck 164. When the process gas is supplied between the upper electrode 166 and the chuck 164 and when the modified RF signal is supplied to the chuck 164, the process gas is ignited to generate plasma within the plasma chamber 112.

The reverse and forward powers $P_{rev}$ and $P_{fwd}$ that are sensed by the sensor 116 are received by the processor 110 via a cable 172A, such as, for example, a cable that facilitates a parallel transfer of data, a cable that facilitates a serial transfer of data, or a Universal Serial Bus (USB) cable. Similarly, reverse and forward powers that are measured by the sensors of the y and z MHz RF generators are received via cables 172B and 172C by the processor 110.

The processor 110 computes theoretical power $P_{deltheor}$, e.g., $P_{delin}$, etc., delivered by the x MHz RF generator to the impedance matching network 102 as a function, e.g., a difference, etc., between the forward power $P_{fwd}$ and the reverse power $P_{rev}$. Similarly, the processor 110 calculates theoretical power delivered by the y and z MHz RF generators to the impedance matching network 102 as a function of forward power supplied by the y and z RF generators and reverse power reflected towards the y and z MHz RF generators from the plasma chamber 112.

In some embodiments, the sensor 116 measures the theoretical power $P_{deltheor}$ at the input 176 of the impedance matching network 102.

The processor 110 further calculates a ratio of the reverse power $P_{rev}$ to the forward power $P_{fwd}$ to generate an RF power reflection ratio $\Gamma^2$ and further computes a magnitude $|\Gamma^2|$ of the RF power reflection ratio. For example, the processor 110 performs a division of the reverse power $P_{rev}$ to the forward power $P_{fwd}$ to generate an RF power reflection ratio $\Gamma^2$. As another example, the RF power reflection ratio is provided as:

$$\Gamma^2 = P_{rev}/P_{fwd} \tag{1}$$

Similarly, the processor 110 calculates RF power reflection ratios from forward and reverse powers received from the sensors of the y and z MHz RF generators.

Moreover, the processor 110 determines a cable power attenuation fraction A of the RF cable 104A based on the frequency of operation of the x MHz RF generator. For example, the processor 110 identifies the cable power attenuation fraction A of the RF cable 104A from a look-up table that includes a list of frequencies of operation of a number of RF generators within a memory device of the host system 118 by looking-up a corresponding frequency of operation of the x MHz RF generator. Based on the frequency of operation of the x MHz RF generator, the cable power attenuation fraction A is identified. Similarly, the processor 110 determines cable power attenuation fractions of the RF cables 104B and 104C.

The processor 110 further calculates a cable power loss $P_{delloss}$ associated with, e.g., incurred by, etc., the RF cable 104A as a function of the RF power reflection ratio $\Gamma^2$ and the cable power attenuation fraction A. For example, the cable power loss $P_{delloss}$ is provided as:

$$P_{delloss} = \left(P_{deltheor} A\left(\frac{1+\Gamma^2}{1-\Gamma^2}\right)\right) \tag{2}$$

The cable power loss $P_{delloss}$ is a product of the theoretical power $P_{deltheor}$, the cable power attenuation fraction A, and a term. The term includes a ratio of a sum of one and the RF power reflection ratio $\Gamma^2$ and a difference of one and the RF power reflection ratio $\Gamma^2$. In some embodiments, the cable power loss $P_{delloss}$ is loss of delivered power occurring within the RF cable 104A. Similarly, the processor 110 computes cable power losses associated with the RF cables 104B and 104C.

The processor 110 calculates actual power $P_{delactual}$ to be delivered to the impedance matching network 102 by the x MHz RF generator based on the theoretical delivered power $P_{deltheor}$ and the cable power loss $P_{delloss}$. For example, the actual power $P_{delactual}$ is computed as a difference between the delivered power $P_{deltheor}$ and the cable power loss $P_{delloss}$ of the RF cable 104A. Similarly, the processor 110 calculates actual powers to be delivered to the impedance matching network 102 by the y and z MHz RF generators.

In some embodiments, the processor 110 sends the calculated actual power $P_{delactual}$ via a cable 174A to the DSP 160 of the x MHz RF generator. Similarly, the processor 110 sends calculated actual powers corresponding to the y and z MHz RF generators via cables 174 and 174C to the DSPs of the y and z MHz RF generators. Examples of each cable 174A, 174B, and 174C include a cable that facilitates a parallel transfer of data, a cable that facilitates a serial transfer of data, and a USB cable.

The DSP 160 receives the calculated actual power $P_{delactual}$ and retrieves, e.g., reads, etc., a drive actual power value corresponding to the actual power $P_{delactual}$ and provides the drive actual power value to the RF supply 162. For example, the DSP 160 identifies, within a look-up table, stored within a memory device of the x MHz RF generator the drive actual power value corresponding to the calculated actual power $P_{delactual}$. As another example, the drive actual power value is the same as the calculated actual power $P_{delactual}$. Similarly, DSPs of the y and z MHz RF generators receive calculated actual power values from the processor 110 via the cables 174B and 174C and retrieve drive actual power values, which are provided to RF supplies of the y and z MHz RF generators.

The RF supply 162 includes a driver (not shown) and an amplifier (not shown), which is connected to the driver. The driver of the RF supply 162 receives the drive actual power value from the DSP 160 and generates an RF signal having the drive actual power value. The amplifier of the RF supply 162 amplifies, e.g., increases a magnitude of, etc., the generated RF signal and sends the amplified RF signal via the RF cable 104A to the impedance matching network 102. In some embodiments, there is no amplification performed and the magnitude of the amplified RF signal is the same as that of the RF signal that is generated by the driver of the RF supply 162. Similarly, amplified RF signals are generated by the RF supplies of the y and z MHz RF generators.

The impedance matching network 102 approximately matches an impedance of a load with that of a source based on the amplified RF signal received from the RF supply 162 via the RF cable 104A and the amplified RF signals received from RF supplies of the y and z MHz RF generators to generate a modified RF signal, and provides the modified RF signal via the RF transmission line 114 to the chuck 164 to generate or modify plasma within the plasma chamber 112. For example, the impedance matching network 102 matches an impedance of a load to be within a threshold of an impedance of a source. As another example, the impedance matching network 102 substantially matches an impedance of a load with an impedance of a source.

In a manner similar to that described above, the impedance matching network 102 generates a modified RF signal based on the RF signals received from the x, y, and z MHz RF generators and provides the modified RF signal via the RF transmission line 114 to the plasma chamber 112 to generate or modify plasma within the plasma chamber 112.

It should be noted that in some embodiments, there is no need to use a sensor 120 at an input 176 of the impedance matching network 102 when the processor 110 is used to generate the calculated actual power $P_{delactual}$. The sensor 120 is used to measure forward power and reverse power at the input 176, which is further used to calculate actual power $P_{delout}$ that is delivered to the input 176 via the RF cable 104A. The sensor 120 is costly and has inaccuracies. The inaccuracies result in generation of an imprecise actual power value by the sensor 120. Moreover, coupling of the sensor 120 to the input 176 and decoupling of the sensor 120 from the input 176 is time consuming. The input 176 is connected to the output 170 of the x MHz RF generator.

In some embodiments, the plasma system 100 includes any number of RF generators. For example, the plasma system 100 includes one or two or four RF generators.

It should further be noted that in some embodiments, the forward powers associated with the x, y, and z RF generators, the reverse powers associated with the RF generators, the theoretical powers associated with the RF generators, the RF power reflection ratios associated with the RF generators, magnitudes of RF power reflection ratios associated with the RF generators, the cable power attenuation fractions associated with the RF cables 104A, 104B, and 104C, and the cable power losses associated with the RF cables, and actual powers delivered to the impedance matching network 102 by the RF generators are stored within the memory device of the host system 118.

In various embodiments, the operations described herein as being performed by the processor 110 are performed by a number of processors, e.g., two or more processors.

In some embodiments, the equation (2) is derived. The derivation is performed by the processor 110 and is described as follows:

$$P_{deltheor} = P_{fwd}[1 - \Gamma^2] \quad (3)$$

$P_{fwd}(1-A)$ is theoretical power that reaches the impedance matching network 102 and $RP_{fwd}(1-A)$ is theoretical power reflected at the impedance matching network 102, where R is an actual power reflection fraction at the impedance matching network 102. $(1-R)P_{fwd}(1-A)$ is theoretical power transmitted, e.g., delivered, etc., to the impedance matching network 102. Theoretical power that returns to an RF generator that is coupled to an RF cable having the cable power attenuation fraction A is $P_{rev} = RP_{fwd}(1-A)^2 = \Gamma^2 P_{fwd} => \Gamma^2 = R(1-A)^2$. Power to be actually delivered to the impedance matching network 102 is:

$$(1-R)P_{fwd}(1-A) = P_{fwd}\left(1 - \frac{\Gamma^2}{(1-A)^2}\right)(1-A) \quad (4)$$

$$= P_{fwd}\left(1 - A - \frac{\Gamma^2}{1-A}\right)$$

$$\approx P_{fwd}(1 - A - \Gamma^2(1+A))$$

$$= P_{fwd}(1-\Gamma^2) - P_{fwd}A(1+\Gamma^2)$$

$$= P_{deltheor} - P_{deltheor}A\frac{1+\Gamma^2}{1-\Gamma^2}$$

FIG. 2A is a diagram of an embodiment of a cable model 180, which is a computer-generated model of an RF cable, e.g., the RF cable 104A, or 104B, or 104C (FIG. 1), etc. The cable model 180 is generated by the processor 110 (FIG. 1) to represent a cable power loss of an RF cable. For example, the cable model 180 represents the cable power loss $P_{delloss}$, which is a loss of delivered power that is attributed by the processor 110 to the RF cable 104A. Power that is delivered at an output 184 of the cable model 180 is a function of a power delivered at an input 182 of the cable model 180 and a cable power loss attributed to an RF cable that is represented by the cable model 180. For example, power $P_{delout}$ that is delivered at an output 184 of the cable model 180 is a difference between the power delivered $P_{delin}$ at an input 182 of the cable model 180 and the cable power loss $P_{delloss}$ that is attributed to the RF cable 104A.

A cable power loss of an RF cable is a function of cable power attenuation fraction of the RF cable and a RF power reflection ratio associated with the RF cable, e.g., the RF cable 104A, or 104B, or 104C (FIG. 1), etc. For example, the cable power loss $P_{delloss}$ attributed by the processor 110 to the RF cable 104A is dependent upon the cable power attenuation fraction A of the RF cable 104A and the RF power reflection ratio $\Gamma^2$ of the RF cable 104A.

FIG. 2B is a diagram of an embodiment of another cable model 182, which is a computer-generated model of an RF cable. The cable model 182 is an example of the cable model 180 (FIG. 2A). Cable power loss that is attributed by the processor 110 to an RF cable is a function of power delivered to an input 188 of the cable model 186, cable power attenuation fraction of the RF cable, and RF power reflection ratio associated with the RF cable. For example, the cable power loss $P_{delloss}$ is provided by equation (2) above. Power delivered at an output 190 of the cable model is a function of the power delivered at the input 188 and the cable power loss associated with the cable model 186. For example, the power $P_{delout}$ delivered at the output 190 is calculated as a difference between the power $P_{delin}$ delivered at the input 188 and the cable power loss $P_{delloss}$ of the RF cable 104A.

It should be noted that the input 188 is an example of the input 182 (FIG. 2A) and the output 190 is an example of the output 184 (FIG. 2A).

FIG. 3 is a diagram used to illustrate that a cable power attenuation fraction associated with attenuation of power by an RF cable is dependent upon a length of the RF cable and a frequency of operation of an RF generator that is connected to the RF cable. For example, the processor 110 (FIG. 1) determines the cable power attenuation fraction A of the RF cable 104A (FIG. 1) based on a length L of the RF cable 104A and a frequency of operation of the x MHz RF generator that is connected to the RF cable 104A and that supplies an RF signal via the RF cable 104A to the impedance matching network 102 (FIG. 1).

Figure 4:
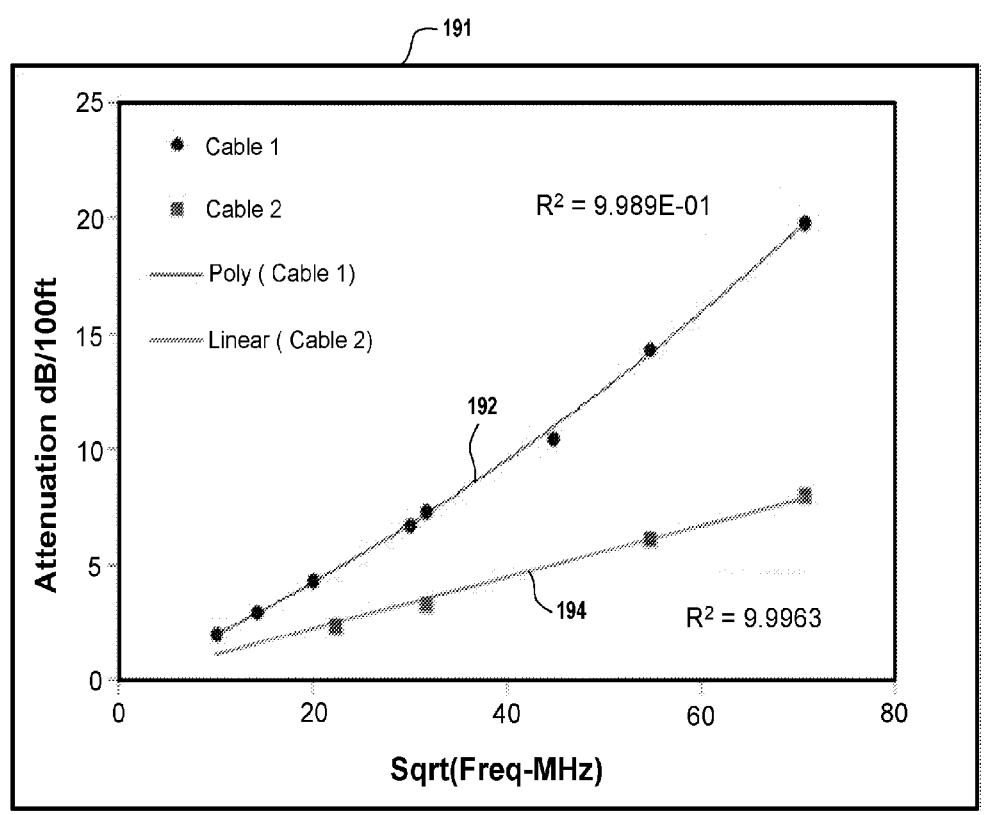
FIG. 4 is an embodiment of a graph to illustrate a relationship between a cable power attenuation fraction of an RF cable and a frequency of an RF generator that is connected to the RF cable to provide an RF signal via the RF cable, in accordance with various embodiments described in the present disclosure.

FIG. 4 is an embodiment of a graph 191 that is shown to illustrate a relationship between a cable power attenuation fraction of an RF cable and a frequency of an RF generator that is connected to the RF cable to provide an RF signal via the RF cable and the impedance matching network 102 (FIG. 1) to the plasma chamber 112 (FIG. 1). The graph 191 includes a plot of a cable power attenuation fraction, measured in decibels per 100 feet, of an RF cable, versus a square root of a frequency of operation of an RF generator that is coupled to the RF cable. The cable power attenuation fraction is plotted on a y-axis and the square root of frequency of operation is plotted on an x-axis.

The graph 191 includes a plot 192 of an RF cable 1 and a plot 194 of another RF cable 2. The plot 194 is linear and the plot 192 is a plot of a polynomial. In some embodiments, the plot 192 is an exponential function.

It should be noted that a cable power attenuation fraction of an RF cable increases with a frequency of operation of an RF generator that is coupled to the RF cable.

In some embodiments, instead of every 100 feet of an RF cable, a cable power attenuation fraction is measured every 10 feet or 1 feet or 2 feet or any other number of feet of the RF cable. In various embodiments, instead of feet, any other unit of length, e.g., meters, or centimeters, or inches, etc., is used.

In various embodiments, a cable power attenuation fraction of an RF cable that is coupled to an RF generator is extrapolated to a frequency of operation of the RF generator by the processor 110 based on high frequencies, e.g., frequencies above 100 MHz, frequencies above 90 MHz, frequencies above 60 MHz etc., and based on cable power attenuation fractions corresponding to the frequencies.

Figure 5:
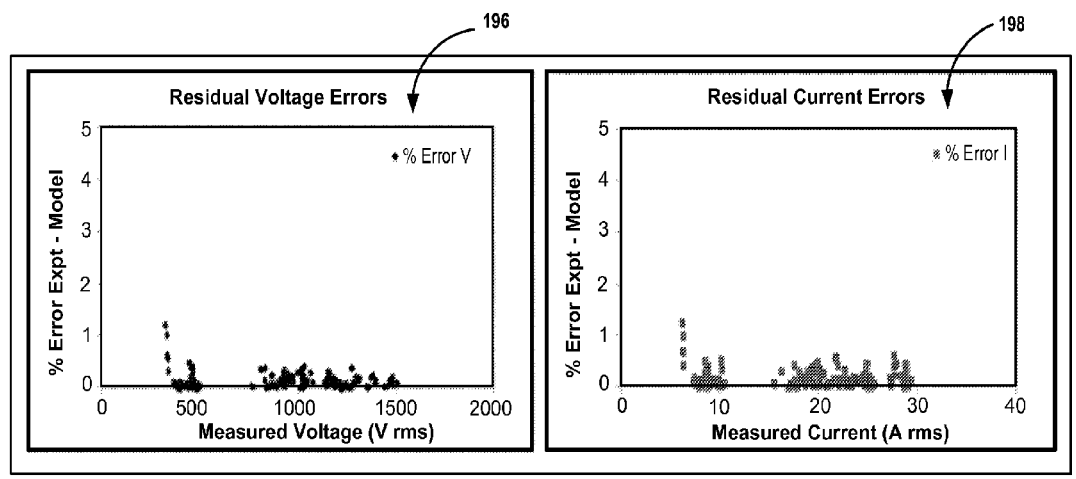
FIG. 5 shows embodiments of graphs to illustrate a relationship between an error between a value of a variable that is generated using a modeled value of the variable without use of an equation and a measured value of the variable, in accordance with several embodiments described in the present disclosure.

FIG. 5 shows embodiments of graphs 196 and 198 to illustrate a relationship between an error between a value of a variable, e.g., voltage, current, etc., that is generated using a modeled value of the variable without use of the equation (2) and a measured value of the variable. For example, the graph 196 plots a percentage error in a modeled voltage that is generated an input of a computer-generated model of an impedance matching network versus a voltage that is measured at the input. Also, in this example, the percentage error is plotted on a y-axis and the measured voltage in plotted on an x-axis. In this example, the measured voltage is sensed using a voltage sensor at an output of an RF cable that is represented by a computer-generated model and that is coupled to the impedance matching network. Further, in this example, the modeled voltage is generated by propagating a value of a voltage at an input of the computer-generated model of the RF cable via the computer-generated model of the RF cable. To illustrate, a modeled voltage is propagated by generating a directional sum of the voltage and of modeled voltages of one or more elements of the computer-generated model of the RF cable. In this illustration, the elements include capacitors, or inductors, or a combination thereof. The elements of the computer-generated model of the RF cable have the same or similar characteristics as that of components of an RF cable that is represented by the computer-generated model. For example, when the RF cable has a capacitance of M and an inductance of N, the elements have a capacitance of M and an inductance of N. As another example, when the components include a real capacitor coupled in series with a real inductor, the elements include a modeled capacitor in series with a modeled inductor. As yet another example, when the components include a real capacitor coupled in parallel with a real inductor, the elements include a modeled capacitor in parallel with a modeled inductor. It should be noted examples of the elements of a computer-generated model include one or more capacitors, one or more inductors, or a combination thereof.

Similarly, the graph 198 plots a percentage error in a modeled current that is generated at an input of a computer-generated model of an impedance matching network versus a current that is measured at the input. The percentage error in current is plotted on a y-axis and the measured current in plotted on an x-axis.

As shown in graphs 196 and 198, percentage errors are close to and above one percent.

In some embodiments, an input of a computer-generated model of an impedance matching network is coupled to an output of a computer-generated model of an RF cable that is connected to the impedance matching network.

Figure 6:
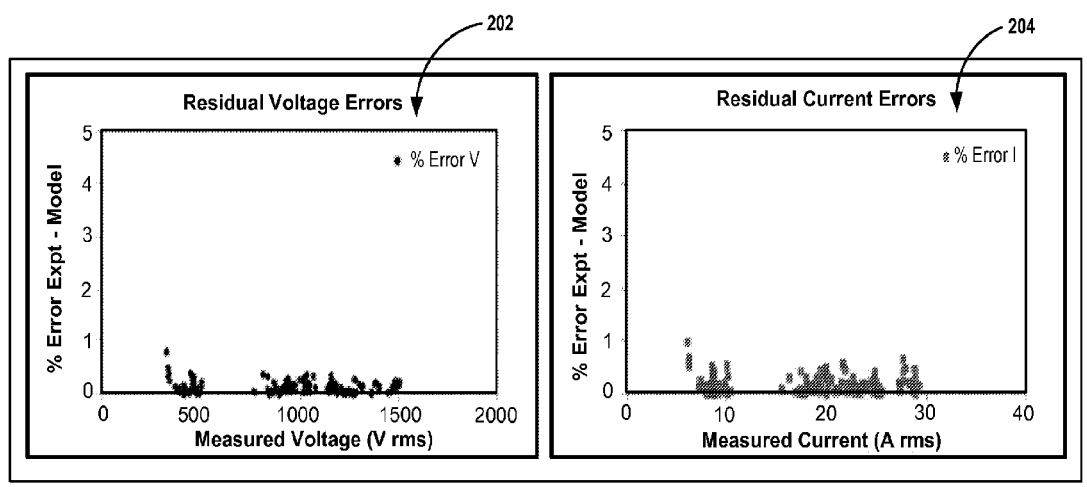
FIG. 6 shows embodiments of graphs to illustrate a reduction in an error in a variable when the equation is used to determine a cable power loss, in accordance with some embodiments described in the present disclosure.

FIG. 6 shows embodiments of graphs 202 and 204 to illustrate a reduction in error in a variable when equation (2) is used to determine a cable power loss. The graph 202 plots a percentage error in a modeled voltage that is determined based on a cable power loss calculated using equation (2) versus a measured voltage, which is voltage measured by coupling a voltage sensor at an input of an impedance matching network that is represented by a computer-generated model. The computed-generated model of the impedance matching network has the modeled voltage at its input. The modeled voltage is generated from the cable power loss by the processor 110 (FIG. 1). The percentage error in the modeled voltage is plotted on a y-axis and the measured voltage is plotted on an x-axis.

Similarly, the graph 204 plots a percentage error in a modeled current that is determined from cable power loss of equation (2) versus a measured current, which is current measured by coupling a current sensor at the input of the impedance matching network that is represented by the computer-generated model of the impedance matching network.

It should be noted that percentage errors illustrated in FIG. 6 are less than the percentage errors illustrated in FIG. 5.

Figure 7:
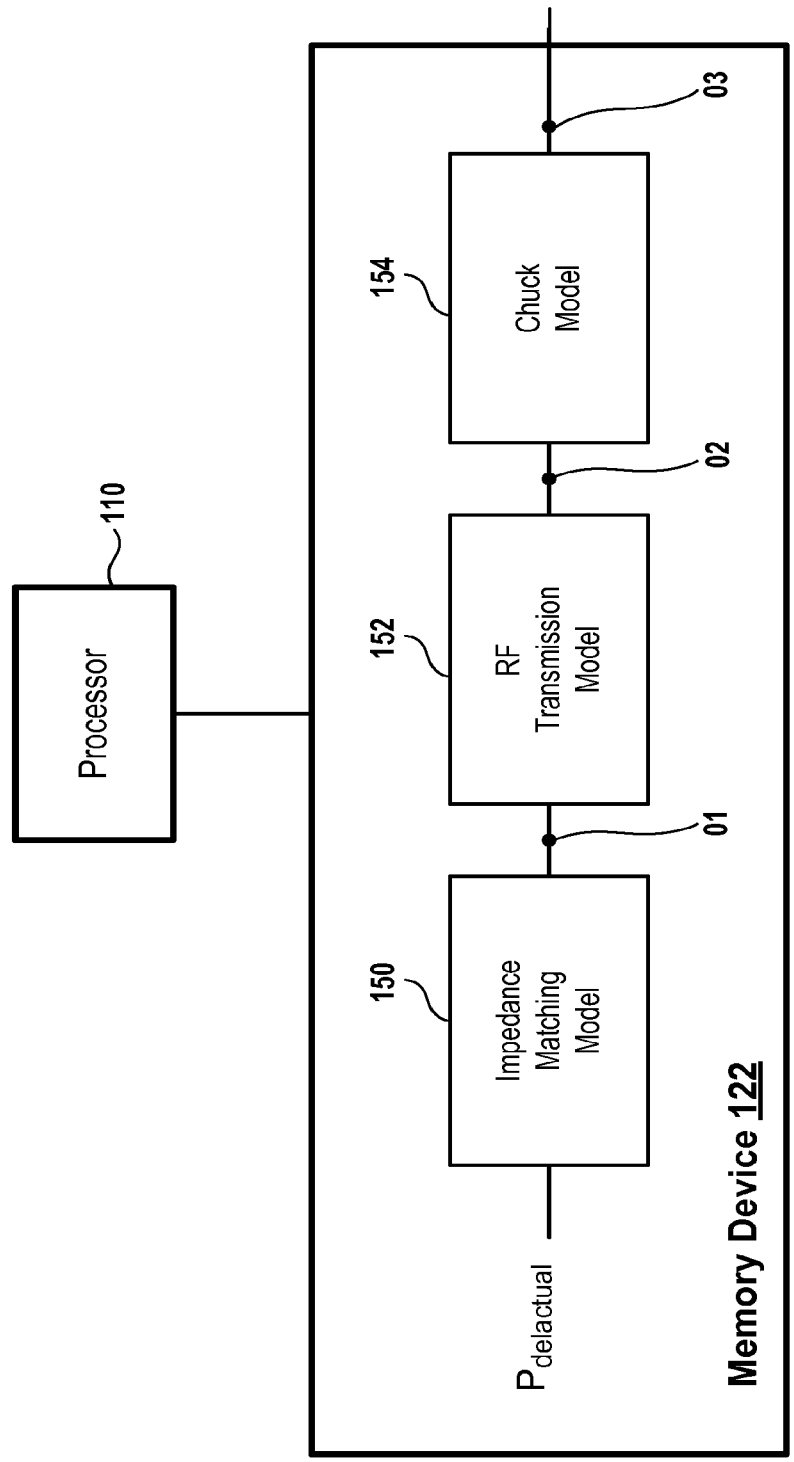
FIG. 7 is a block diagram of an embodiment of a memory device that is used to illustrate use of actual delivered power at an output of an RF cable model to calculate an actual power at an output of a model node of another part of the plasma system, in accordance with various embodiments described in the present disclosure.

FIG. 7 is a block diagram of an embodiment of a memory device 122 that is used to illustrate use of the actual delivered power $P_{delactual}$ to calculate an actual delivered power at an output of a model node. The memory device 122 is a part of the host system 118. The memory device 122 includes an impedance matching model 150, an RF transmission model 152, and a chuck model 154.

The impedance matching model 150 is coupled to the model 180 (FIG. 2) to receive the actual power $P_{delactual}$ from an output of the model 180. The RF transmission model 152 is coupled to the impedance matching model 150 at a model node O1, which is a node at an output of the impedance matching model 150 and at an input of the RF transmission model 152.

Moreover, the chuck model 154 is coupled to the RF transmission model 152 at a model node O2, which is a node at an output of the RF transmission model 152 and at an input of the chuck model 154. Also, the chuck model 54 has a model node O3.

In some embodiments, a model has similar characteristics as that of a corresponding part of the plasma system 100 (FIG. 1). For example, the impedance matching model 150 has similar characteristics, e.g., capacitances, inductances, resistances, complex power, complex voltage and currents, etc., as that of the impedance matching network 102. As an example, the impedance matching model 150 has the same number of capacitors and/or inductors and/or resistors as that within the impedance matching network 102, and the capacitors and/or inductors and/or resistors are connected with each other in the same manner, e.g., serial, parallel, etc. as that within the impedance matching network 102. To provide an illustration, when the impedance matching network 102 includes a capacitor coupled in series with an inductor, the impedance matching model 150 also includes the capacitor coupled in series with the inductor.

As another example, the impedance matching network 102 includes one or more electrical circuit components and the impedance matching model 150 includes a design, e.g., a computer-generated model, of the impedance matching network 102. The computer-generated model may be generated by the processor 110 based upon input signals received from a user via an input hardware unit. The input signals include signals regarding which electrical circuit components, e.g., capacitors, inductors, resistors, etc., to include in a model and a manner, e.g., series, parallel, etc., of coupling the electrical circuit components with each other. As another example, the impedance matching network 102 includes hardware electrical circuit components and hardware connections between the electrical circuit components and the impedance matching model 150 includes software representations of the hardware electrical circuit components and of the hardware connections. As yet another example, the impedance matching model 150 is designed using a software program and the impedance matching network 102 is made on a printed circuit board.

As used herein, in some embodiments, electrical circuit components include resistors, capacitors, inductors, connections between the resistors, connections between the inductors, connections between the capacitors, and/or connections between a combination of the resistors, inductors, and capacitors. Examples of connections between resistors, inductors, and/or capacitors include one or more conductors.

Similarly, the RF transmission model 152 and the RF transmission line 114 have similar characteristics. For example, the RF transmission model 152 has the same number of capacitors and/or inductors as that within the RF transmission line 114, and the capacitors and/or inductors are connected with each other in the same manner, e.g., serial, parallel, etc. as that within the RF transmission line 114. To further illustrate, when the RF transmission line 114 includes a capacitor coupled in parallel with an inductor, the RF transmission model 152 also includes the capacitor coupled in parallel with the inductor. As yet another example, the RF transmission line 114 includes one or more electrical circuit components and the RF transmission model 152 includes a design, e.g., a computer-generated model, of the RF transmission line 114.

Similarly, the chuck model 154 and the chuck 164 have similar characteristics. As an example, an inductance of the chuck model 154 is the same as an inductance of the chuck 164. As another example, a resistance of the chuck model 154 is the same as a resistance of the chuck 164. As another example, the chuck model 154 is a computer-generated model of the chuck 164.

The impedance matching model 150, the RF transmission model 152, and the chuck model 154 are generated by the processor 110.

The actual power $P_{delactual}$ is propagated via the impedance matching model 150 to the model node O1. For example, a directional sum of the actual power $P_{delactual}$ and power values of delivered power associated with electrical circuit components of the impedance matching model 150 is calculated to generate an actual delivered power at the model node O1. Moreover, in some embodiments, the actual delivered power at the model node O1 is propagated via electrical circuit components of the RF transmission model 152 to generate actual delivered power at the model node O2. Also, in various embodiments, the actual delivered power at the model node O2 is propagated via electrical circuit components of the chuck model 154 to generate an actual delivered power at the model node O3. For example, a directional sum of the actual delivered power at the model node O2 and of actual delivered power of electrical circuit components of the chuck model 154 is calculated to generate an actual delivered power at the output node O3.

In various embodiments, the actual power $P_{delactual}$ is propagated via a portion of the impedance matching model 150 to generate actual delivered power at an intermediate model node within the impedance matching model 150. The intermediate model node is between electrical circuit components of the impedance matching model 150 at one side of the intermediate model node and electrical circuit components of the impedance matching model 150 at another side of the intermediate model node.

Similarly, in some embodiments, the actual delivered power at the model node O1 is propagated via a portion of the RF transmission model 152 to generate actual delivered power at an intermediate model node within the RF transmission model 152. The intermediate model node of the RF transmission model 152 is between electrical circuit components of the RF transmission model 152 at one side of the intermediate model node and electrical circuit components of the RF transmission model 152 at another side of the intermediate model node.

Moreover, in various embodiments, the actual delivered power at the model node O2 is propagated via a portion of the chuck model 154 to generate actual delivered power at an intermediate model node within the chuck model 154. The intermediate model node of the chuck model 154 is between electrical circuit components of the chuck model 154 at one side of the intermediate model node and electrical circuit components of the chuck model 154 at another side of the intermediate model node.

In some embodiments, the actual power $P_{delactual}$, the actual power at the model node O1, the actual power at the model node O2, and/or the actual power at the model node O3 is sent by the processor 110 to one or more of the x, y, and z MHz RF generators to control RF signals that are generated by the one or more of the x, y, and z MHz RF generators to control plasma within the plasma chamber 112. For example, the processor 110 identifies that the actual power $P_{delactual}$ exceeds a threshold. The processor 110 sends a signal to the DSP 160 of the x MHz RF generator to change power of an RF signal supplied by the RF supply 162. The RF signal with the changed amount of power is sent via the RF cable 104A (FIG. 1), the impedance matching network 102, and the RF transmission line 114 (FIG. 1) to the chuck 164 to modify properties of plasma within the plasma chamber 112 to achieve the threshold.

In some embodiments, any functions described herein as performed by the processor 110 are performed by a processor of an RF generator or by a combination of the processor 110 and the processor of the RF generator.

Figure 8:
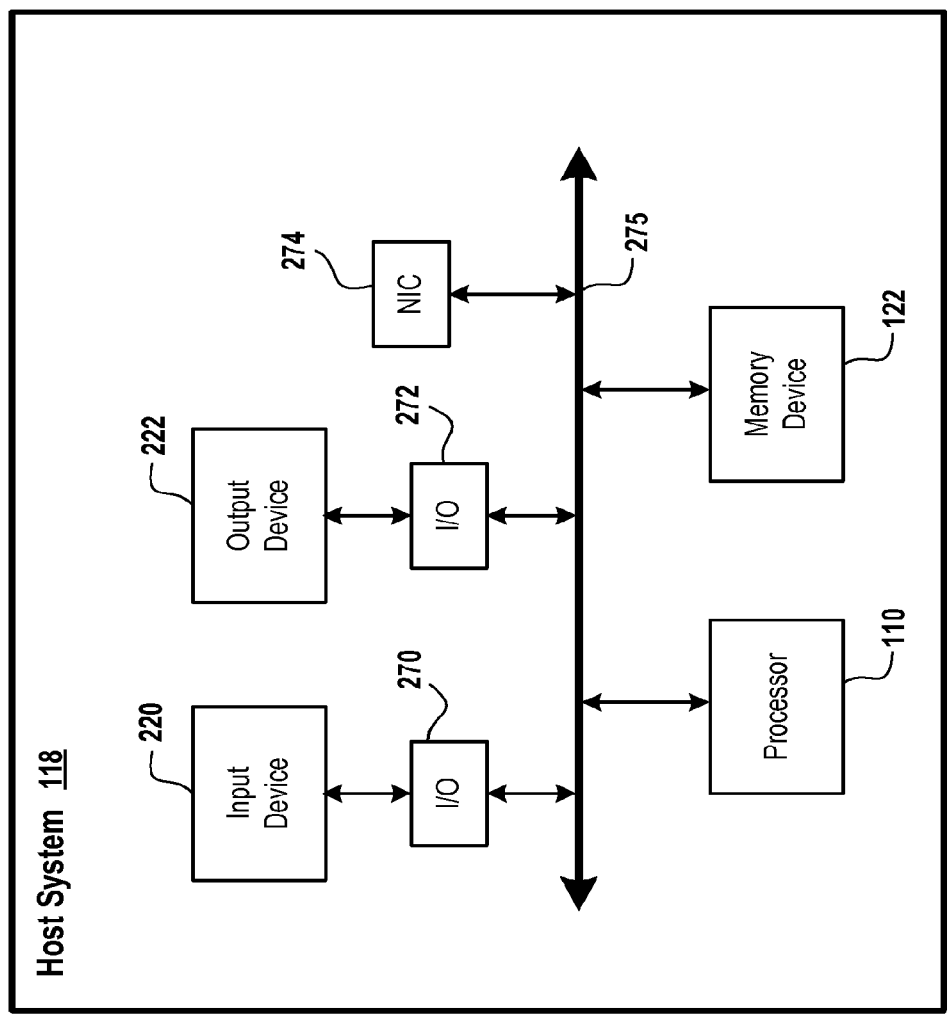
FIG. 8 is a diagram of a host system, in accordance with several embodiments described in the present disclosure.

FIG. 8 is a diagram of an embodiment of the host system 118. The host system 118 includes the processor 110, a memory device 122, an input device 220, an output device 222, an input/output (I/O) interface 270, an I/O interface 272, a network interface controller (NIC) 274, and a bus 275. The processor 110, the memory device 122, the input device 220, the output device 222, the I/O interface 270, the I/O interface 272, and the NIC 274 are coupled with each other via the bus 275. Examples of the input device 220 include a mouse, a keyboard, a stylus, etc. Examples of the output device 222 include a display, a speaker, or a combination thereof. The display may be a liquid crystal display, a light emitting diode display, a cathode ray tube, a plasma display, etc. Examples of the NIC 274 include a network interface card, a network adapter, etc.

Examples of an I/O interface include an interface that provides compatibility between pieces of hardware coupled to the interface. For example, the I/O interface 270 converts a signal received from the input device 220 into a form, amplitude, and/or speed compatible with the bus 275. As another example, the I/O interface 272 converts a signal received from the bus 275 into a form, amplitude, and/or speed compatible with the output device 222.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber of an inductively coupled plasma (ICP) reactor, or of a transformer coupled plasma (TCP) reactor, conductor tools, or of an electron-cyclotron resonance (ECR) reactor, etc. For example, the x MHz RF generator, the y MHz RF generator, and the z MHz RF generator are coupled to an inductor within a plasma chamber of the ICP reactor.

It is also noted that although the operations above are described as being performed by the processor 110, in some embodiments, the operations may be performed by one or more processors of the host system 118, or by multiple processors of multiple host systems, or by multiple processors of RF generators.

It should be noted that although the above-described embodiments relate to providing an RF signal to the lower electrode of a chuck of a plasma chamber, and grounding an upper electrode of the plasma chamber, in several embodiments, the RF signal is provided to the upper electrode while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. In some embodiments, the non-transitory computer-readable medium is a memory device that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for using a computer-generated model to determine power at an output of a radio frequency (RF) cable, comprising:
    receiving a measurement of power at an output of an RF generator from a sensor located within the RF generator, wherein said receiving the measurement of power is performed when the RF generator is coupled via the RF cable to an impedance matching network and the impedance matching network is coupled via an RF transmission line to a plasma chamber;
    generating, by a computer, a computer model of the RF cable, wherein the computer model of the RF cable has an input and an output, wherein the measurement is received at the input of the computer model;
    propagating the power measured at the output of the RF generator from the input of the computer model via the computer model to the output of the computer model to determine power at the output of the computer model; and
    controlling power supplied by the RF generator based on the power at the output of the computer model.

2. The method of claim 1, wherein the power is measured by a sensor that follows a National Institute of Standards and Technology (NIST) standard.

3. The method of claim 1, wherein the computer model is generated from a cable power attenuation fraction of the RF cable and an RF power reflection ratio, wherein the cable power attenuation fraction is generated from a length of the RF cable and a frequency of operation of the RF generator, wherein the RF power reflection ratio is generated from power that is reflected towards the RF generator and power that is supplied by the RF generator.

4. The method of claim 3, wherein propagating the power measured at the output of the RF generator comprises computing the power at the output of the computer model based on the power measured at the output of the RF generator, the cable power attenuation fraction, and the RF power reflection ratio.

5. The method of claim 1, wherein said controlling the RF generator comprises sending a control signal to the RF generator to change an amount of the power generated and supplied by the RF generator.

6. A system for using a computer-generated model to determine power at an output of a radio frequency (RF) cable, comprising:
an RF generator having an output that is coupled to a sensor, wherein the sensor is located within the RF generator;
an RF cable coupled to the output of the RF generator;
an impedance matching network coupled to the RF cable;
an RF transmission line coupled to the impedance matching network;
a plasma chamber coupled to the RF transmission line; and
a host computer system coupled to the sensor, wherein the host computer system is configured to:
receive a measurement of power at the output of the RF generator;
generate a computer model of the RF cable, wherein the computer model of the RF cable has an input and an output, wherein the measurement is received at the input of the computer model;
propagate the power measured at the output of the RF generator from the input of the computer model via the computer model to the output of the computer model to determine power at the output of the computer model; and
control power that is supplied by the RF generator based on the power at the output of the computer model.

7. The system of claim 6, wherein the sensor follows a National Institute of Standards and Technology (NIST) standard.

8. The system of claim 6, wherein the computer model is generated from a cable power attenuation fraction of the RF cable and an RF power reflection ratio, wherein the cable power attenuation fraction is generated from a length of the RF cable and a frequency of operation of the RF generator, wherein the RF power reflection ratio is generated from power that is reflected towards the RF generator and power that is supplied by the RF generator.

9. The system of claim 8, wherein the host computer system is configured to compute the power at the output of the computer model based on the power measured at the output of the RF generator, the cable power attenuation fraction, and the RF power reflection ratio.

10. The system of claim 6, wherein the host computer system is configured to send a control signal to the RF generator to change an amount of the power generated and supplied by the RF generator.

11. A non-transitory computer readable medium storing a program causing a computer to execute a method comprising:
receiving a measurement of power at an output of a radio frequency (RF) generator from a sensor located within the RF generator, wherein said receiving the measurement of power is performed when the RF generator is coupled via an RF cable to an impedance matching network and the impedance matching network is coupled via an RF transmission line to a plasma chamber;
generating a computer model of the RF cable, wherein the computer model of the RF cable has an input and an output, wherein the measurement is received at the input of the computer model;
propagating the power measured at the output of the RF generator from the input of the computer model via the computer model to the output of the computer model to determine power at the output of the computer model; and
controlling power supplied by the RF generator based on the power at the output of the computer model.

12. The non-transitory computer readable medium of claim 11, wherein the measurement is made by a sensor that follows a National Institute of Standards and Technology (NIST) standard.

13. The non-transitory computer readable medium of claim 11, wherein the computer model is generated from a cable power attenuation fraction of the RF cable and an RF power reflection ratio, wherein the cable power attenuation fraction is generated from a length of the RF cable and a frequency of operation of the RF generator, wherein the RF power reflection ratio is generated from power that is reflected towards the RF generator and power that is supplied by the RF generator.

14. The non-transitory computer readable medium of claim 13, wherein propagating the power measured at the output of the RF generator comprises computing the power at the output of the computer model based on the power measured at the output of the RF generator, the cable power attenuation fraction, and the RF power reflection ratio.

15. The non-transitory computer readable medium of claim 11, wherein the method further comprises controlling the RF generator based on the power at the output of the computer model, wherein said controlling the RF generator comprises sending a control signal to the RF generator to change an amount of the power generated and supplied by the RF generator.

* * * * *